United States Patent
Grundvig et al.

(10) Patent No.: US 7,120,390 B2
(45) Date of Patent: Oct. 10, 2006

(54) BLUETOOTH SMART OFFSET COMPENSATION

(75) Inventors: Jeffrey P. Grundvig, Loveland, CO (US); Carl R. Stevenson, Emmaus, PA (US)

(73) Assignee: Agere Systems Inc., Allentown, PA (US)

( * ) Notice: Subject to any disclaimer, the term of this patent is extended or adjusted under 35 U.S.C. 154(b) by 904 days.

(21) Appl. No.: 09/813,001

(22) Filed: Mar. 21, 2001

(65) Prior Publication Data

US 2002/0137461 A1    Sep. 26, 2002

(51) Int. Cl.
- *H04B 7/00* (2006.01)
- *H04B 1/04* (2006.01)
- *H04B 1/18* (2006.01)
- *H04B 1/06* (2006.01)

(52) U.S. Cl. .................. 455/41.2; 455/113; 455/182.2; 455/192.1; 455/255; 455/502; 455/507

(58) Field of Classification Search ............... 455/41.2, 455/41.3, 113, 119, 182.2, 185.1, 186.1, 192.1, 455/192.2, 255, 257, 265, 502, 507
See application file for complete search history.

(56) References Cited

U.S. PATENT DOCUMENTS

| | | | | |
|---|---|---|---|---|
| 5,142,279 A | * | 8/1992 | Jasinski et al. | 340/7.22 |
| 5,884,178 A | * | 3/1999 | Ericsson et al. | 455/441 |
| 6,308,076 B1 | * | 10/2001 | Hoirup et al. | 455/502 |
| 6,725,024 B1 | * | 4/2004 | Lindoff et al. | 455/255 |
| 6,975,613 B1 | * | 12/2005 | Johansson | 370/338 |
| 2002/0151275 A1 | * | 10/2002 | Trost et al. | 455/41 |
| 2003/0040292 A1 | * | 2/2003 | Peterzell et al. | 455/147 |

\* cited by examiner

*Primary Examiner*—George Eng
*Assistant Examiner*—Un C. Cho

(57) ABSTRACT

An offset history table is implemented and maintained in a BLUETOOTH device and is used to pre-seed an expected frequency offset of a received signal from another BLUETOOTH device. The disclosed offset history table includes one entry for each piconet device in a particular piconet, each entry including a best guess of the relevant piconet device's frequency offset with respect to the receiving BLUETOOTH device. Using a frequency offset history table and a pre-seeded frequency offset corresponding to an expected frequency offset based on the offset value maintained in the frequency offset history table, the performance of a BLUETOOTH device can be increased in a steady state piconet scenario.

10 Claims, 5 Drawing Sheets

FIG. 2

| SLAVE ADDR | LAST BEST OFFSET |
|---|---|
| S1 | +3 kHz |
| S2 | −7.122 kHz |
| S3 | 0.10 kHz |
| S4 | +72.14 kHz |
| S5 | −74.00 kHz |
| S6 | 0.119 kHz |
| S7 | 7.000 kHz |

201, 202, 203, 204, 205, 206, 207

←100

STANDARD PACKET FORMAT

ACCESS CODE FORMAT

BLUETOOTH SMART OFFSET COMPENSATION

BACKGROUND OF THE INVENTION

1. Field of the Invention

The present invention relates to piconet wireless networks. More particularly, it relates to frequency offset compensation between piconet devices such as BLUETOOTH™ conforming wireless piconet devices.

2. Background of Related Art

Piconets, or small wireless networks, are being formed by more and more devices in many homes and offices. In particular, a popular piconet standard is commonly referred to as a BLUETOOTH piconet. Piconet technology in general, and BLUETOOTH technology in particular, provides peer-to-peer communications over short distances.

The wireless frequency of piconets may be 2.4 GHz as per BLUETOOTH standards, and/or typically have a 20 to 100 foot range. The piconet RF transmitter may operate in common frequencies which do not necessarily require a license from the regulating government authorities, e.g., the Federal Communications Commission (FCC) in the United States. Alternatively, the wireless communication can be accomplished with infrared (IR) transmitters and receivers, but this is less preferable because of the directional and visual problems often associated with IR systems.

A plurality of piconet networks may be interconnected through a scatternet connection, in accordance with BLUETOOTH protocols. BLUETOOTH network technology may be utilized to implement a wireless piconet network connection (including scatternet). The BLUETOOTH standard for wireless piconet networks is well known, and is available from many sources, e.g., from the web site www.bluetooth.com.

According to the BLUETOOTH specification, BLUETOOTH systems typically operate in a range of 2400 to 2483.5 MHz, with multiple RF channels. For instance, in the US, 79 RF channels are defined as f=2402+k MHz, k=0, . . . , 78. This corresponds to 1 MHz channel spacing, with a lower guard band (e.g., 2 MHz) and an upper guard band (e.g., 3.5 MHz).

FIG. 4 depicts a piconet including a master BLUETOOTH device M1, and three slave BLUETOOTH devices S1–S3. As depicted in FIG. 4, communications from each of the slave BLUETOOTH devices S1–S3 carries its own frequency offset possibilities.

For instance, according to BLUETOOTH standards, the transmitted initial center frequency accuracy must be +/−75 kHz from a channel center frequency $f_c$. The initial frequency accuracy is defined as being the frequency accuracy before any information is transmitted. The frequency drift requirement is not included in the +/−75 kHz. In a one slot packet, the maximum frequency drift in a packet is +/−25 kHz.

The channel is represented by a pseudo-random hopping sequence hopping through the 79 or 23 RF channels. The hopping sequence is unique for the piconet and is determined by the BLUETOOTH device address of the master; the phase in the hopping sequence is determined by the BLUETOOTH clock of the master. The channel is divided into time slots where each slot corresponds to an RF hop frequency. Consecutive hops correspond to different RF hop frequencies. The nominal hop rate is 1600 hops/s. All BLUETOOTH units participating in the piconet are time- and hop-synchronized to the channel.

The channel is divided into time slots, each 625 uS in length. The time slots are numbered according to the BLUETOOTH clock of the piconet master. The slot numbering ranges from 0 to $2^{27}-1$ and is cyclic with a cycle length of $2^{27}$.

In the time slots, master and slave can transmit packets. A time division duplex (TDD) scheme is used where master and slave alternatively transmit. The master starts its transmission in even-numbered time slots only, and the slave starts its transmission in odd-numbered time slots only. The packet start is aligned with the slot start. Packets transmitted by the master or the slave may extend over up to five time slots.

The RF hop frequency remains fixed for the duration of a packet. For a single packet, the RF hop frequency to be used is derived from the current BLUETOOTH clock value. For a multi-slot packet, the RF hop frequency used for the entire packet is derived from the BLUETOOTH clock value in the first slot of the packet. The RF hop frequency in the first slot after a multi-slot packet uses the frequency as determined by the current BLUETOOTH clock value.

If a packet occupies more than one time slot, the hop frequency applied is the hop frequency as applied in the time slot where the packet transmission was started.

Data on the piconet channel is conveyed in packets. FIG. 5A shows the general packet format 500 as described in the BLUETOOTH specification.

In particular, as shown in FIG. 5A, each standard BLUETOOTH packet 500 includes an access code 502, a header 504, and a payload 506. The access code 502 and header 504 are of fixed size: 72 bits and 54 bits, respectively. The payload 506 can range from zero to a maximum of 2745 bits. Different packet types have been defined. Packets may consist of a shortened access code 502 only, of the access code 502 and header 504, or of the access code 502, header 504, and payload 506.

Each standard packet 500 starts with an access code 502. If a packet header 504 follows, the access code 502 is 72 bits long. Otherwise, the access code 502 is 68 bits long. This access code 502 is used for synchronization, DC offset compensation and identification. The access code 502 identifies all packets 500 exchanged on the channel of the piconet: all packets sent in the same piconet are preceded by the same channel access code.

In the receiver of the BLUETOOTH device, a sliding correlator correlates against the access code 502 and triggers when a threshold is exceeded. This trigger signal is used to determine the receive timing.

FIG. 5B shows in more detail the access code 502 of the standard packet 500 shown in FIG. 5A.

In particular, as shown in FIG. 5B, the access code 502 of the standard packet 500 includes a preamble 510, a sync word 512, and possibly a trailer 514.

The preamble 510 is a fixed zero-one pattern of 4 symbols used to facilitate DC compensation. The sequence is either 1010 or 0101, depending on whether the LSB of the following sync word is 1 or 0, respectively.

The sync word 512 is a 64-bit code word derived from a 24 bit address lower address part (LAP).

Thus, the BLUETOOTH specification allows for up to +/−75 kHz of initial frequency offset for a transmitter at the start of a burst. If one assumes that both transmitter and receiver have the same tolerance, then this would imply that up to +/−150 kHz offset may exist between a transmitter of a first wireless piconet device and a receiver of another wireless piconet device at the beginning of any given packet. Furthermore, since from a master's perspective consecutive slot packets coming from different slaves have no relationship to each other in terms of frequency offset, they too could be as much as 150 kHz different. This is a fairly significant offset considering that the minimum FSK tone deviation is only 115 kHz.

BLUETOOTH devices typically require a receiver in any given BLUETOOTH device to perform a frequency offset correction during the preamble of each and every packet. However, this requirement poses a challenge because there are only five (5) bits of preamble 10101 used to train the receiver before the sync word needs to be demodulated and recognized.

Prior attempts have focused on increasing the speed with which frequency offset is computed during the five (5) bit preamble. However, increased speeds typically require more powerful (and expensive) processors, and generally increase power draw requirements.

There is a need for an improved apparatus and technique for compensating for frequency offsets as between piconet devices in a quick and efficient manner.

SUMMARY OF THE INVENTION

In accordance with the principles of the present invention, a smart compensation wireless piconet device comprises a wireless piconet front end including a receiver portion and a transmitter portion. A frequency offset history table contains a plurality of entries each corresponding to a past frequency offset of one device in a piconet including the smart compensation wireless piconet device. An expected center frequency of a signal received by the receiver portion is adjusted based on one of the plurality of entries in the frequency offset history table corresponding to a device transmitting the signal.

A method for receiving in a receiving piconet device an information packet transmitted from a transmitting piconet device within a piconet network in accordance with another aspect of the present invention comprises determining a center frequency of a channel used to transmit at least a portion of the information packet. A past frequency offset value of the transmitting piconet device is looked up. A center frequency of an expected frequency of the information packet is adjusted in a receiving portion of the receiving piconet device, and the information packet is received in the receiving piconet device.

BRIEF DESCRIPTION OF THE DRAWINGS

Features and advantages of the present invention will become apparent to those skilled in the art from the following description with reference to the drawings, in which:

FIG. 2 shows in more detail the entries in an exemplary center frequency offset history table shown in FIG. 1.

DETAILED DESCRIPTION OF ILLUSTRATIVE EMBODIMENTS

In accordance with the principles of the present invention, an offset history table is implemented and maintained in a BLUETOOTH device and is used to pre-seed an expected frequency offset of a received signal from another BLUETOOTH device. The disclosed offset history table includes one entry for each piconet device in a particular piconet, each entry including a best guess of the relevant piconet device's frequency offset with respect to the receiving BLUETOOTH device.

Using a frequency offset history table and a pre-seeded frequency offset corresponding to an expected frequency offset based on the offset value maintained in the frequency offset history table, the performance of a BLUETOOTH device can be increased in a steady state piconet scenario.

Figure 1:
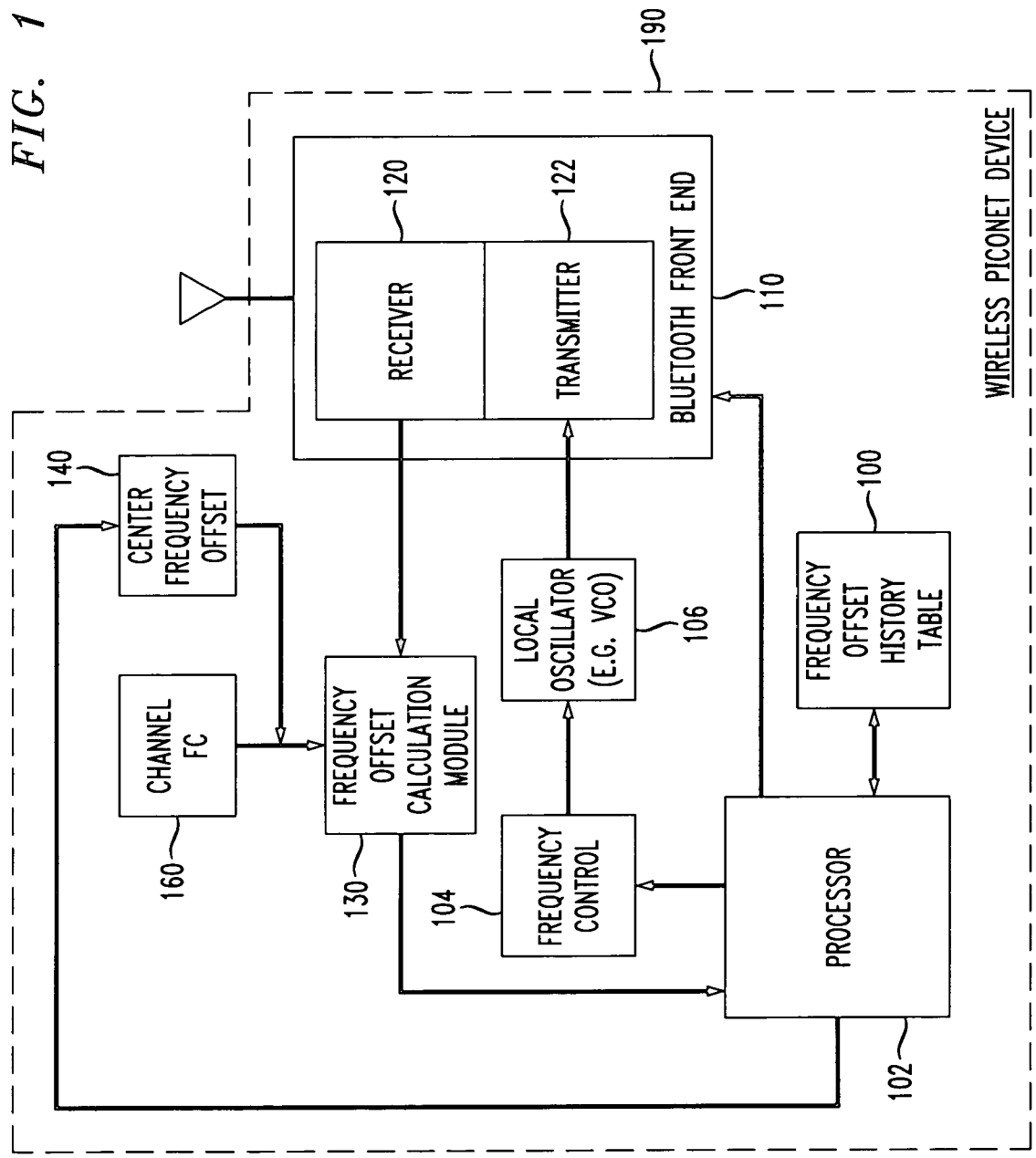
FIG. 1 shows a wireless piconet device having "smart compensation" capability through the inclusion of a frequency offset history table and a frequency offset capability of a piconet receiver (e.g., BLUETOOTH compatible receiver), in accordance with the principles of the present invention.

FIG. 1 shows a wireless piconet device 190 having "smart compensation" capability through the inclusion of a frequency offset history table 100 and a frequency offset capability 140 of a piconet receiver 120 (e.g., BLUETOOTH compatible receiver), in accordance with the principles of the present invention.

In particular, as shown in FIG. 1, a wireless piconet device 190 includes a processor 102 and a wireless piconet front end 110.

The processor 102 may be any suitable processor, e.g., a microprocessor, a microcontroller, or a digital signal processor (DSP).

The wireless piconet front end 110 may be any suitable piconet standard, although the embodiments described herein relate to the BLUETOOH standard.

The wireless piconet device 190 further includes an otherwise conventional transmitter local oscillator 106 (e.g., a voltage controlled oscillator (VCO), and frequency control 104 suitable for setting and appropriately hopping the center frequency of an output piconet signal packet. The wireless piconet device 190 also includes a receiver portion 120, which feeds a received signal for processing to determine a received frequency in an otherwise conventional frequency offset calculation module 130.

The frequency offset calculation module 130 determines an actual frequency of a received signal based on an expected channel center frequency $f_c$, but most importantly further based on a center frequency offset value 140. The center frequency offset value 140 is based on a best guess as to the expected frequency offset of the signal received from the relevant slave BLUETOOTH device based on a lookup in a frequency offset history table 100.

In accordance with one embodiment of the present invention, a master BLUETOOTH device of a piconet includes the frequency offset history table 100 and center frequency offset pre-set 140 capability.

FIG. 2 shows in more detail the entries in an exemplary center frequency offset history table 100 shown in FIG. 1.

In particular, as shown in FIG. 2, the disclosed center frequency offset history table 100 includes a plurality of entries 201–207. Each entry 201–207 relates to an active slave BLUETOOTH device in the relevant piconet network.

While center frequency offset history table 100 shown in FIG. 2 includes the capability to store frequency offset measurements for each of seven active BLUETOOTH devices, the scope of the present invention encompasses a larger or smaller number of entries. For instance, the center frequency offset history table 100 may be enlarged significantly to include expected frequency offset values for parked or otherwise inactive BLUETOOTH devices in the piconet or scatternet.

Moreover, while the frequency offset history table 100 is described at times from the perspective of a master BLUETOOTH device (i.e., all other piconet devices would be slave BLUETOOTH devices), in the case of implementation in a slave BLUETOOTH device, one of the entries in the center frequency offset history table 100 may relate to a master BLUETOOTH device while the other entries in the center frequency offset history table 100 would relate to slave BLUETOOTH devices.

While the frequency offset values of active slave devices are maintained in the disclosed embodiments, the maintenance of any/all devices in a piconet, active or parked, may be maintained within the scope of the present invention.

As shown in FIG. 2, the center frequency offset history table 100 includes seven (7) entries, each corresponding to one of the other active BLUETOOTH devices in the relevant piconet. Each entry 201–207 individually and preferably independently keeps track of the last best guess as to an expected frequency offset for each of the other active devices in the piconet.

For example, as shown in the first entry 201 of the frequency offset history table 100 of FIG. 2, a signal received from slave BLUETOOTH device S1 appears to be 3 kHz higher than the expected nominal center frequency of the channel in which the slave BLUETOOTH device is communicating. Thus, before receiving a signal from slave S1, the master BLUETOOTH device including the "smart compensation" technology would pre-seed or adjust the value of the nominal channel center frequency by 3 kHz by setting the center frequency offset value 140 to 3 kHz.

Similarly, packets received from any of the second through seventh piconet devices S2–S7 would instigate a pre-seeding of the center frequency offset value 140 in the receiver end 120 of the BLUETOOTH front end 110 to −7.122 kHz, 0.10 kHz, 72.14 kHz, −74.00 kHz, 0.119 kHz and 7.000 kHz, respectively.

In the disclosed embodiments, the frequency offset value stored in the frequency offset history table is preferably measured during receipt of the access code 502 (e.g., 72 bit access code) at the start of the standard packet 500. However, other techniques of timings of measurement of the frequency offset of a received signal is within the scope of the present invention.

For instance, the expected frequency offset values maintained in the entries 201–207 of the frequency offset history table 100 may be a moving average of frequency offsets measured over a past number of received packets. Alternatively, the frequency offset value maintained in the frequency offset history table 100 may be a mean determined over a past number of received packets, a maximum frequency offset determined over a past number of received packets, or a minimum frequency offset determined over a past number of received packets.

The entries 201–207 in the frequency offset history table 100 may initially be set to an appropriate default value, e.g., zero (0), until otherwise updated by the processor 102.

The determination of frequency offset at a particular point in the received communication message is important, whether or not it is at the start of the packet, midstream in the packet, or at the end of the packet, since the frequency may drift during the payload depending on the particular implementation. It is currently preferred that the frequency offset be measured based on a frequency at the start of the received packet.

The computed offset for a given BLUETOOTH slave device is then stored or re-stored in the relevant entry 201–207 in the frequency offset history table 100. Thereafter, when the next communication with that BLUETOOTH slave device is initiated from the master BLUETOOTH device, that stored or re-stored value of the frequency offset for that particular BLUETOOTH device will be used as a best guess as to the expected frequency offset of a signal received from the relevant BLUETOOTH slave device, and thus moved to the center frequency offset 140 to inform the frequency offset calculation module 130 of the channel center frequency as adjusted for expected frequency offset. This pre-seeding of the frequency offset speeds up the amount of time needed to compute the actual frequency offset and to set the local oscillator to a new frequency based on the computed frequency offset, reducing the need for faster and more powerful processors, and/or reducing power consumption.

The receiver of the relevant piconet device, e.g., the master BLUETOOTH device, is pre-seeded or set based on the last best guess of the expected frequency offset of the relevant slave device, and is used for the slave to master burst, rather than starting communications with a presumed offset of zero (0), i.e., from scratch as in prior art BLUETOOTh devices. Furthermore, the master BLUETOOTH device can also adjust its own local oscillator to match the frequency offset of the slave BLUETOOTH device for the master to slave burst as well, so that the slave during receive mode would also be starting out with a small frequency offset. Thus, even if only the master BLUETOOTH device in a piconet includes a frequency offset history table in accordance with the principles of the present invention, the efficiency of all piconet devices in the particular piconet may be improved.

In addition to moving or resetting its local oscillator (LO), the master BLUETOOTH device can narrow its receive bandwidth continuously while running in this steady state mode, rather than waiting for access code detect to happen as is conventionally performed. This results in a more reliable link and better performance, both from an access code detection point of view as well as from a data payload point of view, particularly if a frequency offset calculation is periodically or occasionally performed. This effectively 'fine tunes' the expected frequency offset value for the particular slave BLUETOOTH device maintained in the frequency offset history table.

When the master BLUETOOTH device needs to look for new devices in the piconet, it would have to open up its receive bandwidth to an otherwise conventional bandwidth to accommodate unknown offsets, but thereafter can narrow it back down by pre-seeding an expected frequency offset when returning to communicate with a known active BLUETOOTH device.

A frequency offset history table can also be implemented in a slave BLUETOOTH device. In such an implementation, it is preferred that a command or identifier be used such that the slave BLUETOOTH device would first query the master BLUETOOTH device to determine if the master BLUETOOTH device includes "smart offset" logic implementing the frequency offset history table therein. If not, then the querying BLUETOOTH device can avoid pre-seeding an expected frequency offset at the same time that the other communicating BLUETOOTH device also pre-seeds an expected frequency offset. If the querying slave BLUE- TOOTH device determines from its query that the master BLUETOOTH device either does not include a frequency offset history table and pre-seeding capability in accordance with the principles of the present invention, or refrains from seeding an expected frequency offset for communications with that particular querying slave BLUETOOTH device, then the slave BLUETOOTH device including a frequency offset history table and expected frequency offset pre-seeding capability can adjust itself for the expected frequency offset, thus improving at least that one master to slave BLUETOOTH device link in the piconet.

On the other hand, even if the querying slave BLUETOOTH device determines that the master BLUETOOTH device includes "smart offset" capability including a frequency offset history table, the slave BLUETOOTH device can nevertheless still narrow its receive bandwidth in accordance with the expected frequency offset of a signal from the master BLUETOOTH device without adjusting its own local oscillator.

Yet another alternative implementation which avoids the need for a slave BLUETOOTH device to query a master BLUETOOTH device has any master or slave BLUETOOTH device simply change its local oscillator only during its receive window according to its frequency offset history table. Thus, the master BLUETOOTH device would not perform any pre-seeding of expected frequency offset compensation to help the slave BLUETOOTH devices receive, but only for its own receive functions. Therefore, in accordance with this embodiment, the master BLUETOOTH device adjusts its local oscillator between transmit and receive such that it is not pre-set, or set to a nominal channel frequency during a transmit function, and is pre-set to accommodate an expected frequency offset value based on a value for the relevant piconet device obtained from the frequency offset history table during a receive function. While this embodiment simplifies the protocol requirements for implementing "smart offset" frequency compensation, it does not provide a significant benefit to "dumb" slaves (i.e., conventional slave BLUETOOTH devices) from a "smart" master including a frequency offset history table in accordance with the principles of the present invention.

Figure 3:
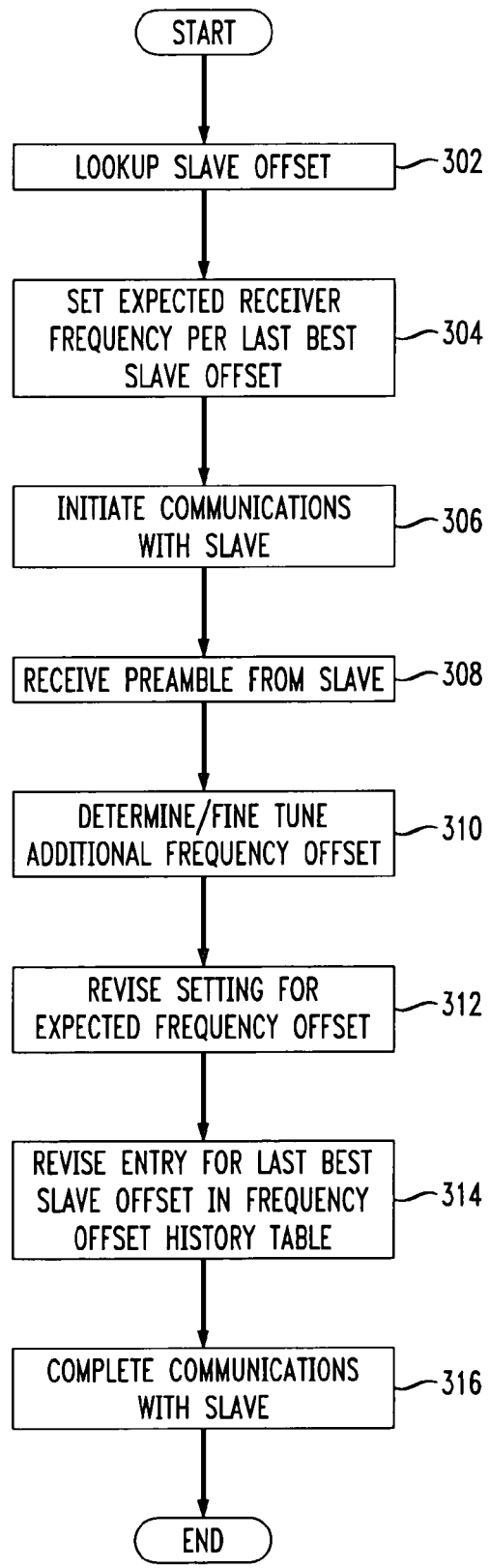
FIG. 3 shows an exemplary process in a piconet such as a wireless BLUETOOTH piconet by which a frequency offset of a receiver is adjusted based on a look up of a historical frequency offset value for the particular transmitting device, in accordance with the principles of the present invention.
Figure 4:
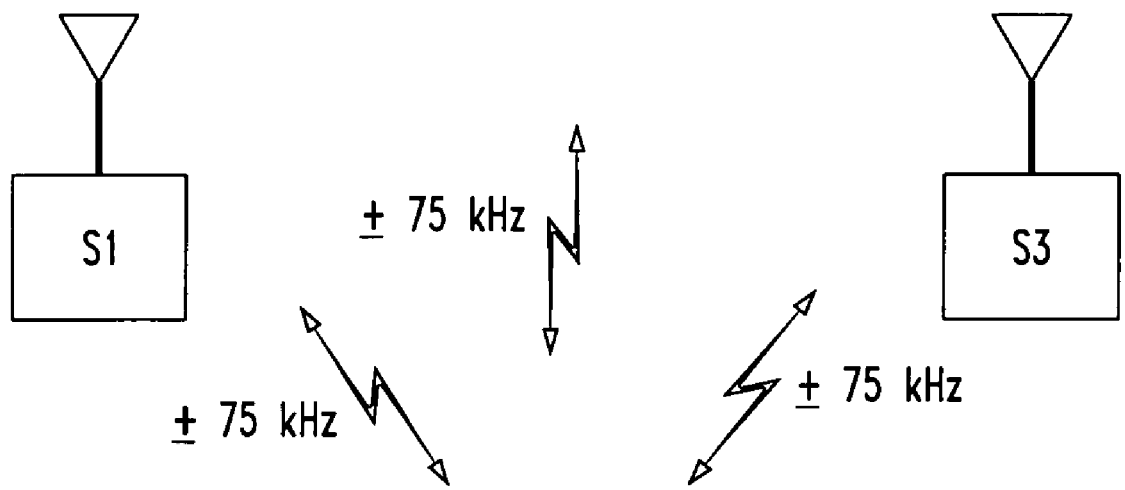
FIG. 4 depicts a piconet including a master BLUETOOTH device, and three slave BLUETOOTH devices.
Figure 5A:
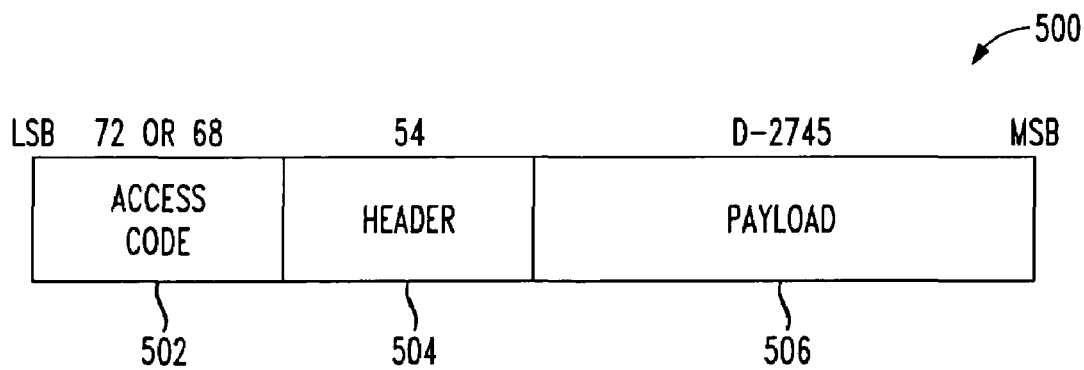
FIG. 5A shows the general packet format as described in the BLUETOOTH specification.
Figure 5B:
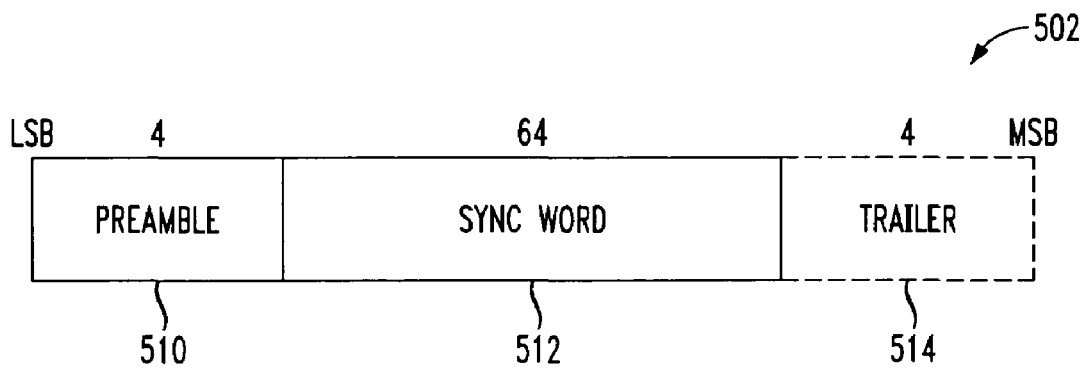
FIG. 5B shows in more detail the access code of the standard packet shown in FIG. 5A.

As an example, FIG. 3 shows an exemplary process in a piconet such as a wireless BLUETOOTH piconet by which a frequency offset of a receiver is adjusted based on a look up of a historical frequency offset value for the particular transmitting device, in accordance with the principles of the present invention.

In particular, as shown in step 302 of FIG. 3, a master BLUETOOTH device desiring to initiate communication with a particular slave BLUETOOTH device looks up a maintained value for an expected frequency offset for signals received from the particular slave BLUETOOTH device.

Note that in accordance with the principles of the present invention, the historical frequency offset information is with respect to the calibration of the receiving BLUETOOTH device. Thus, two different BLUETOOTH devices may and likely will detect slightly different values for frequency offset of a signal received from the same device.

In step 304, the expected receiver frequency offset 140 is set in the receiver portion 120 of the BLUETOOTH front end 110 based on the value retrieved from the look-up performed in step 302.

In step 306, communications are initiated with the receiver of the master BLUETOOTH device appropriately pre-seeded with a particular receive channel center frequency as adjusted by the expected frequency offset for that particular transmitting BLUETOOTH device.

In step 308, the preamble is received from the transmitting slave BLUETOOTH device.

In step 310, the frequency offset is programmed into the receiver portion of the BLUETOOTH front end 110.

In steps 312 and 314, the frequency offset calculation module 130 calculates an actual frequency offset of the received signal, e.g., at the start of the packet, and restores that actual frequency offset in the appropriate entry of the frequency offset history table 100 relating to the transmitting BLUETOOTH device.

Thereafter, as depicted in step 316, the communications are completed.

While pre-seeding expected frequency offsets based on values maintained in a frequency offset history table may not improve performance in all BLUETOOTH device implementations, it can improve performance in the vast majority of applications where multiple communications are performed between various BLUETOOTH devices.

While the invention has been described with reference to the exemplary preferred embodiments thereof, those skilled in the art will be able to make various modifications to the described embodiments of the invention without departing from the true spirit and scope of the invention.

What is claimed is:

1. A method for receiving in a receiving piconet device an information packet transmitted from a transmitting piconet device within a piconet network, comprising:
   determining a center frequency of a channel used to transmit at least a portion of said information packet;
   looking up a past frequency offset value of said transmitting piconet device;
   adjusting a center frequency of an expected frequency of said information packet in a receiving portion of said receiving piconet device;
   receiving said information packet in said receiving piconet device; and
   replacing in said receiving piconet device said past frequency offset value for said transmitting piconet device with a new frequency offset calculated based on a calculated actual frequency offset.

2. The method for receiving in a receiving piconet device an information packet transmitted from a transmitting piconet device within a piconet network according to claim 1, further comprising:
   altering a local oscillator of said receiving piconet device wherein a transmit frequency of a transmitter of said receiving piconet device is offset by an amount approximately equal and opposite to a past amount of frequency offset calculated from a past information packet received from said transmitting piconet device.

3. The method for receiving in a receiving piconet device an information packet transmitted from a transmitting piconet device within a piconet network according to claim 1, further comprising:
   calculating an actual frequency offset based on said received information packet.

4. The method for receiving in a receiving piconet device an information packet transmitted from a transmitting piconet device within a piconet network according to claim 1, wherein:
   said receiving piconet device and said transmitting piconet device are each BLUETOOTH devices.

5. A method for receiving in a receiving piconet device an information packet transmitted from a transmitting piconet device within a piconet network, comprising:

determining a center frequency of a channel used to transmit at least a portion of said information packet;

looking up a past frequency offset value of said transmitting piconet device;

adjusting a center frequency of an expected frequency of said information packet in a receiving portion of said receiving piconet device;

receiving said information packet in said receiving piconet device;

calculating an actual frequency offset based on said received information packet; and replacing in said receiving piconet device said past frequency offset value for said transmitting piconet device with a new frequency offset calculated based on said calculated actual frequency offset.

6. Apparatus for receiving in a receiving piconet device an information packet transmitted from a transmitting piconet device within a piconet network, comprising:

means for determining a center frequency of a channel used to transmit at least a portion of said information packet;

means for looking up a past frequency offset value of said transmitting piconet device;

means for adjusting a center frequency of an expected frequency of said information packet in a receiving portion of said receiving piconet device;

means for receiving said information packet in said receiving piconet; and means for replacing in said receiving piconet device said past frequency offset value for said transmitting piconet device with a new frequency offset calculated based on a calculated actual frequency offset.

7. The apparatus for receiving in a receiving piconet device an information packet transmitted from a transmitting piconet device within a piconet network according to claim 6, further comprising:

means for altering a local oscillator of said receiving piconet device wherein a transmit frequency of a transmitter of said receiving piconet device is offset by an amount approximately equal and opposite to a past amount of frequency offset calculated from a past information packet received from said transmitting piconet device.

8. The apparatus for receiving in a receiving piconet device an information packet transmitted from a transmitting piconet device within a piconet network according to claim 6, further comprising:

means for calculating an actual frequency offset based on said received information packet.

9. The apparatus for receiving in a receiving piconet device an information packet transmitted from a transmitting piconet device within a piconet network according to claim 6, wherein:

said receiving piconet device and said transmitting piconet device are each BLUETOOTH devices.

10. Apparatus for receiving in a receiving piconet device an information packet transmitted from a transmitting piconet device within a piconet network, comprising:

means for determining a center frequency of a channel used to transmit at least a portion of said information packet;

means for looking up a past frequency offset value of said transmitting piconet device;

means for adjusting a center frequency of an expected frequency of said information packet in a receiving portion of said receiving piconet device;

means for receiving said information packet in said receiving piconet device;

means for calculating an actual frequency offset based on said received information packet; and means for replacing in said receiving piconet device said past frequency offset value for said transmitting piconet device with a new frequency offset calculated based on said calculated actual frequency offset.

* * * * *